(12) United States Patent
Hsieh

(10) Patent No.: US 10,023,672 B2
(45) Date of Patent: Jul. 17, 2018

(54) POLYPHENYLENE OXIDE PREPOLYMER, METHOD OF MAKING THE SAME, RESIN COMPOSITION AND PRODUCT MADE THEREFROM

(71) Applicant: Elite Material Co., Ltd., Taoyuan City (TW)

(72) Inventor: Chen-Yu Hsieh, Taoyuan (TW)

(73) Assignee: ELITE MATERIAL CO., LTD., Taoyuan (TW)

( * ) Notice: Subject to any disclaimer, the term of this patent is extended or adjusted under 35 U.S.C. 154(b) by 35 days.

(21) Appl. No.: 15/353,154

(22) Filed: Nov. 16, 2016

(65) Prior Publication Data

US 2017/0342178 A1 Nov. 30, 2017

Related U.S. Application Data

(60) Provisional application No. 62/340,690, filed on May 24, 2016.

(51) Int. Cl.
| | |
|---|---|
| *C08F 216/16* | (2006.01) |
| *C08J 5/24* | (2006.01) |
| *C08K 3/36* | (2006.01) |
| *C08L 29/10* | (2006.01) |

(52) U.S. Cl.
CPC .......... *C08F 216/165* (2013.01); *C08J 5/24* (2013.01); *C08K 3/36* (2013.01); *C08L 29/10* (2013.01); *C08J 2329/10* (2013.01)

(58) Field of Classification Search
CPC .......... C08F 216/165; C08L 29/10; C08J 5/24; C08K 3/36
See application file for complete search history.

(56) References Cited

U.S. PATENT DOCUMENTS

| | | | |
|---|---|---|---|
| 2010/0076396 A1* | 3/2010 | Takahashi | B32B 15/08 604/408 |
| 2015/0044485 A1* | 2/2015 | Wang | H05K 1/0353 428/462 |

\* cited by examiner

*Primary Examiner* — Robert Harlan
(74) *Attorney, Agent, or Firm* — Muncy, Geissler Olds & Lowe, P.C.

(57) ABSTRACT

Provided is a process of making a polyphenylene oxide prepolymer, comprising a step of reacting a reactive cycloolefin and a vinyl-containing polyphenylene oxide in the presence of a ruthenium catalyst. The reactive cycloolefin may be selected from dicyclopentadiene monomer, dicyclopentadiene oligomer, dicyclopentadiene polymer, norbornene monomer, norbornene oligomer, norbornene polymer, and a combination thereof; the vinyl-containing polyphenylene oxide may be selected from divinylbenzyl polyphenylene oxide resin, vinylbenzyl-modified polyphenylene oxide resin, methacrylic polyphenylene oxide resin, and a combination thereof; the ruthenium catalyst may be a Grubbs catalyst. Also provided are a polyphenylene oxide prepolymer made by the process, a resin composition containing the polyphenylene oxide prepolymer, and a product made from the resin composition.

20 Claims, 1 Drawing Sheet

POLYPHENYLENE OXIDE PREPOLYMER, METHOD OF MAKING THE SAME, RESIN COMPOSITION AND PRODUCT MADE THEREFROM

CROSS-REFERENCE TO RELATED APPLICATIONS

This application claims priority of Provisional Patent Application Ser. No. 62/340,690, filed on May 24, 2016, the entirety of which is incorporated by reference herein.

BACKGROUND OF THE INVENTION

Field of the Invention

The present disclosure generally relates to a polyphenylene oxide resin composition useful for preparing a resin film, a prepreg, a laminate or a printed circuit board.

Description of Related Art

Conventionally, cycloolefin polymers are made from addition polymerization of cycloolefin monomers. Cycloolefin polymers have excellent light transmittance and are therefore useful as raw materials for the production of optical components, such as lenses or light guide plates. However, because cycloolefin polymers do not contain a benzene ring in their chemical structure, the flame retardancy of cycloolefin polymers is much worse than aromatic compounds.

SUMMARY OF THE INVENTION

The primary object of the present disclosure is to provide a polyphenylene oxide prepolymer, which is made by polymerizing a reactive cycloolefin and a vinyl-containing polyphenylene oxide with a ruthenium catalyst.

According to one embodiment, in the polyphenylene oxide prepolymer, the ratio of the reactive cycloolefin to the vinyl-containing polyphenylene oxide may range from 99:1 to 1:99. The content or ratio of the ruthenium catalyst is not particularly limited but may range from 0.001 to 0.1 parts by weight relative to a total of 100 parts by weight of the reactive cycloolefin and the vinyl-containing polyphenylene oxide.

Preferably, the ratio by weight of the reactive cycloolefin to the vinyl-containing polyphenylene oxide may be, for example, 90:10, 80:20, 70:30, 60:40, 55:45, 50:50, 45:55, 40:60, 30:70, 20:80, or 10:90, but not limited thereto. For example, the ratio of the reactive cycloolefin to the vinyl-containing polyphenylene oxide may also be 75:25.

Obtained by pre-polymerization of a cycloolefin and a vinyl-containing polyphenylene oxide, the polyphenylene oxide prepolymer is characterized by containing a vinyl group after pre-polymerization.

The reactive cycloolefin is selected from dicyclopentadiene (DCPD) monomer, dicyclopentadiene oligomer, dicyclopentadiene polymer, norbornene monomer, norbornene oligomer, norbornene polymer, or a combination thereof.

The dicyclopentadiene monomer is represented by the following formula (1).

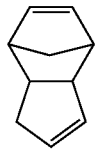

(1)

The dicyclopentadiene oligomer, such as an oligomer of 2 to 3 monomers, having relatively low molecular weight, such as a weight-average molecular weight of 200 to 400, is obtained by polymerizing the dicyclopentadiene monomer with the use of the ruthenium catalyst.

The dicyclopentadiene polymer is obtained by subjecting the dicyclopentadiene monomer to polymerization with the use of the ruthenium catalyst.

The norbornene monomer is represented by the following formula (2).

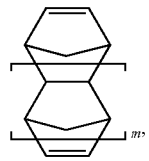

(2)

wherein m is a natural number ranging from 0 to 10 and preferably from 0 to 4.

The norbornene oligomer, having relatively low molecular weight, is obtained by polymerizing the norbornene monomer with the use of ruthenium catalyst.

The norbornene polymer is obtained by subjecting the norbornene monomer to polymerization with the use of the ruthenium catalyst.

The vinyl-containing polyphenylene oxide is a polyphenylene oxide capped by vinyl groups, and the vinyl-containing polyphenylene oxide may be, but not limited to, for example divinylbenzyl polyphenylene oxide resin (trade name OPE-2st, available from Mitsubishi Gas Chemical Co., Inc.), vinylbenzyl-modified polyphenylene oxide resin or methacrylic polyphenylene oxide resin (trade name SA-9000, available from SABIC).

The ruthenium catalyst is a catalyst containing a ruthenium (Ru) atom.

Preferably, the ruthenium catalyst is a Grubbs catalyst.

Preferably, the ruthenium catalyst is selected from the group consisting of the following Grubbs catalysts and a combination thereof:

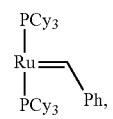

wherein Cy represents cyclohexyl and Ph represents phenyl;

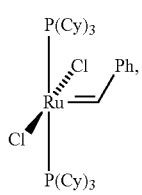

such as benzylidene-bis(tricyclohexylphosphine)dichlororuthenium;

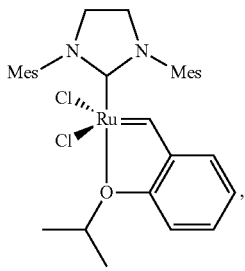

wherein Mes represents 2,4,6-trimethylphenyl, such as [1,3-bis-(2,4,6-trimethylphenyl)-2-imidazolidinylidene]dichloro(o-isopropoxyphenyl methylene)ruthenium;

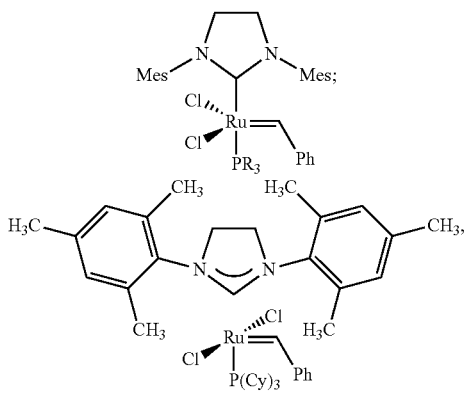

such as (1,3-bis(2,4,6-trimethylphenyl)-2-imidazolidinylidene)dichloro(phenylmethylene)(tricyclohexylphosphine)ruthenium; and

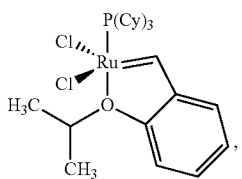

such as dichloro(o-isopropoxyphenylmethylene) (tricyclohexylphosphine)ruthenium(II).

Preferably, the ruthenium catalyst may be a Grubbs catalyst listed as follows, but not limited thereto: dichloro(o-isopropoxyphenylmethylene)(tricyclohexylphosphine)ruthenium(II) and ((1,3-bis-(2,4,6-trimethylphenyl)-2-imidazolidinylidene)dichloro (o-isopropoxyphenylmethylene) ruthenium).

Disclosed is a method of producing a polyphenylene oxide prepolymer, comprising: adding a reactive cycloolefin and a vinyl-containing polyphenylene oxide to a reaction tank, well-mixing and stirring the same, followed by adding a ruthenium catalyst and stirring for 8 to 24 hours at a constant temperature ranging from 50 to 100° C., such as for 12 hours at 80° C., and finally obtaining the product as a polyphenylene oxide prepolymer.

Disclosed is a resin composition, comprising the aforesaid polyphenylene oxide prepolymer and an additive.

The additive may be selected from the group consisting of, for example, polyphenylene oxide, cyanate ester, maleimide, polyolefin, acrylate, 1,1'-[(octahydro-4,7-methano-1H-indene-5,6-diyl)bis(methylene)]ester (e.g. SR833S, commercially available from Cray Valley), styrene, bromostyrene, 2-propenoic acid, divinylbenzene (DVB), bis(vinylbenzyl) ether (BVBE), triallyl isocyanurate (TAIC), triallyl cyanurate (TAC), 1,2,4-trivinylcyclohexane (TVCH), diallyl bisphenol A, 2-propenoic acid, and a combination thereof. The content of each additive or any combination thereof may range from 1 to 50 parts by weight relative to 100 parts by weight of the polyphenylene oxide prepolymer.

The polyolefin may be selected from the group consisting of, for example, styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene copolymer, polybutadiene (homopolymer of butadiene), maleic anhydride-styrene-butadiene copolymer, methyl styrene copolymer, and a combination thereof.

The resin composition may further optionally comprise any one or any combination of epoxy resin, phenolic resin, benzoxazine resin, styrene maleic anhydride, polyester, amine curing agent, polyamide, and polyimide.

The resin composition may further comprise flame retardant, inorganic filler, curing accelerator, and solvent.

Another object of the present disclosure is to provide a product made from the resin composition, such as a resin film, a prepreg, a laminate or a printed circuit board, but not limited thereto.

The product made from the resin composition may be a resin film, which is obtained by curing the resin composition such as by baking and heating. The resin composition can be selectively coated on a polyethylene terephthalate film (PET film), a polyimide film (PI film) or a resin coated copper (RCC), followed by baking and heating to cure the resin composition so as to form the resin film.

The product made from the resin composition may be a prepreg, comprising a reinforcement material and a layered article arranged on the reinforcement material. The layered article is formed by subjecting the resin composition to high temperature heating to cure it to a semi-cured stage. The baking temperature for making the prepreg ranges between 80° C. and 170° C. The reinforcement material may be fibrous material, woven fabric and non-woven fabric, such as fiberglass cloth, which can increase the mechanical strength of the prepreg. Preferably, the reinforcement material can be optionally pre-treated by a silane coupling agent.

The product made from the resin composition may be a laminate, which comprises two metal foils and an insulation layer (i.e. the aforesaid layered article) arranged between the metal foils. The insulation layer may be formed by subjecting the resin composition to a high temperature and high pressure condition, wherein the suitable curing temperature may range between 150° C. and 220° C. The insulation layer may be the aforesaid prepreg or resin film. The metal foil may comprise copper, aluminum, nickel, platinum, silver, gold or an alloy thereof. Copper foil is an example of the metal foil.

Preferably, the laminate is a copper clad laminate (CCL).

Preferably, the laminate may be subject to trace formation processes to provide a circuit board.

The material of the present disclosure, such as the aforesaid resin composition, is mainly characterized in that the polyphenylene oxide prepolymer is formed by using the ruthenium catalyst to promote the crosslinking reaction between the reactive cycloolefin and the vinyl-containing polyphenylene oxide. Compared with conventional approaches such as using a peroxide to make cycloolefin or not pre-polymerizing cycloolefin and vinyl-containing polyphenylene oxide, inventors of the present application found that, by using the ruthenium catalyst to pre-polymerize cycloolefin and vinyl-containing polyphenylene oxide, the polyphenylene oxide prepolymer thus obtained achieves the following unexpected results:

(1) The prepreg made from the resin composition according to the present disclosure may be further processed by conventional CCL processes to make a copper clad laminate. A copper-free laminate obtained by etching off the surface copper foils of the copper-clad laminate is then subject to a pressure cooking test (PCT) by reference to IPC-TM-650 2.6.16.1 for five hours. A comparison of dissipation factor (DO at 10 GHz frequency before and after the test shows that the copper-free laminate made by using the resin composition according to the present disclosure unexpectedly maintains a low dissipation factor after the test, such as lower than 0.0050.

(2) The prepreg made from the resin composition according to the present disclosure may be further processed by conventional CCL processes to make a copper clad laminate. A copper-free laminate obtained by etching off the surface copper foils of the copper-clad laminate is then subject to the measurement of dissipation factor at room temperature (25° C.) and high temperature (120° C.). The result shows that the copper-free laminate made by using the resin composition according to the present disclosure unexpectedly has a small increase in dissipation factor of less than 20%, 15%, or 10% or between 10% and 15% from room temperature to high temperature.

DETAILED DESCRIPTION OF THE EMBODIMENTS

Figure 1:
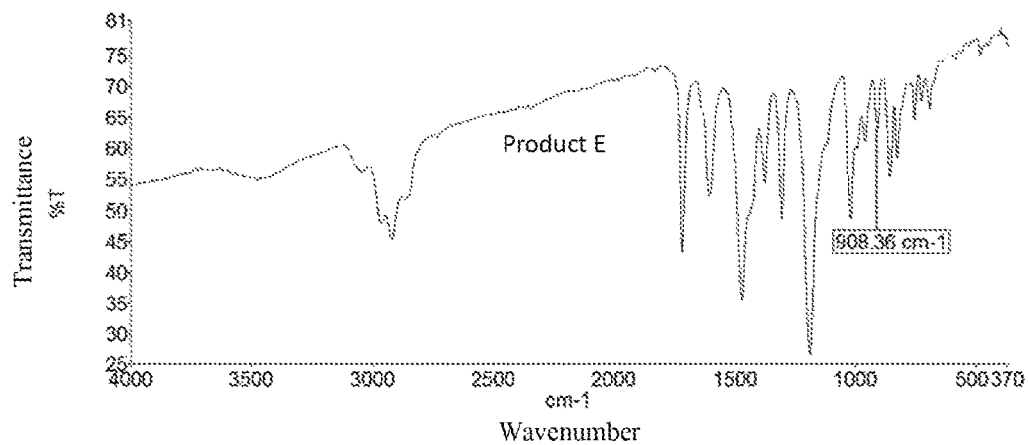
FIG. 1 illustrates the FTIR spectrum of Product E polyphenylene oxide prepolymer of Preparation Example 5.

To enable those skilled in the art to further appreciate the features and effects of the present disclosure, words and terms contained in the specification and appended claims are described and defined. Unless otherwise defined, all technical and scientific terms used herein have the same meaning as commonly understood by those of ordinary skill in the art to which this disclosure pertains. In the case of conflict, the present document and definitions contained herein will control.

Theories or mechanisms described and disclosed herein, whether they are right or wrong, should in no way limit the scope of the present disclosure so long as the present disclosure may be practiced without regard for any particular theory or mechanism.

The use of "a," "an" or similar expression is employed to describe elements and features described herein. This is done merely for convenience and to give a general sense of the scope of the present disclosure. Accordingly, this description should be read to include one or at least one and the singular also includes the plural unless it is obvious to mean otherwise.

As used herein, the term "comprises," "comprising," "includes," "including," "has," "having" or any other variant thereof is construed as an open-ended transitional phrase intended to cover a non-exclusive inclusion. For example, a composition or manufacture that comprises a list of elements is not necessarily limited to only those elements but may include other elements not expressly listed or inherent to such composition or manufacture. Further, unless expressly stated to the contrary, the term "or" refers to an inclusive or and not to an exclusive or. For example, a condition "A or B" is satisfied by any one of the following: A is true (or present) and B is false (or not present), A is false (or not present) and B is true (or present), and both A and B are true (or present). In addition, whenever open-ended transitional phrases are used, such as "comprises," "comprising," "includes," "including," "has," "having" or any other variant thereof, it is understood that transitional phrases such as "consisting essentially of" and "consisting of" are also disclosed and included.

In this disclosure, value, amount and content and concentration of ingredients are generally presented as a range or a percentage range; however, the description in range or percentage range format is merely for convenience and brevity and therefore should be interpreted as encompassing and specifically disclosing all possible subranges and individual numerals or values therein, particularly all integers therein. For example, a range of "1 to 8" or "between 1 and 8" should be understood as explicitly disclosing all subranges such as 1 to 7, 2 to 8, 2 to 6, 3 to 6, 4 to 8, 3 to 8 and so no, particularly all subranges defined by integers, as well as disclosing all individual values such as 1, 2, 3, 4, 5, 6, 7 and 8. Unless otherwise defined, the aforesaid interpretation rule should be applied throughout the present disclosure regardless broadness of the scope.

Whenever amount, concentration or other numeral or parameter is expressed as a range, a preferred range or a series of upper and lower limits, it is understood that all ranges defined by any pair of the upper limit or preferred value and the lower limit or preferred value are specifically disclosed, regardless whether these ranges are explicitly described or not. In addition, unless otherwise defined, whenever a range is mentioned, the range should be interpreted as inclusive of the endpoints and every integers and fractions in the range.

Given the intended purposes and advantages of this disclosure are achieved, numerals or figures have the precision of their significant digits. For example, 40.0 should be understood as covering a range of 39.50 to 40.49.

As used herein, a Markush group or a list of items is used to describe examples or embodiments of the present disclosure. A skilled artisan will appreciate that all subgroups of members or items and individual members or items of the Markush group or list can also be used to describe the present disclosure. For example, when X is described as being "selected from a group consisting of $X_1$, $X_2$ and $X_3$,"

it is intended to disclose the situations of X is $X_1$ and X is $X_1$ and/or $X_2$. In addition, when a Markush group or a list of items is used to describe examples or embodiments of the present disclosure, a skilled artisan will understand that any subgroup or any combination of the members or items in the Markush group or list may also be used to describe the present disclosure. Therefore, when X is described as being "selected from a group consisting of $X_1$, $X_2$ and $X_3$," and Y is described as being "selected from a group consisting of $Y_1$, $Y_2$ and $Y_3$," the disclosure of any combination of X is $X_1$ and/or $X_2$ and/or $X_3$ and Y is $Y_1$ and/or $Y_2$ and/or $Y_3$ is fully presented.

The present disclosure is further described in conjunction with the embodiments and examples below. It is understood that these embodiments and examples are merely exemplary without limiting the scope of the present disclosure. Methods, reagents and conditions employed therein, unless specified otherwise, are known to those skilled in the art.

Chemical reagents used in the examples and comparative examples are listed below.

DCPD monomer: 1,3-dicyclopentadiene, available from SIGMA-ALDRICH;

Grubbs $2^{nd}$ generation catalyst: (1,3-bis(2,4,6-trimethylphenyl)-2-imidazolidinylidene)dichloro(phenylmethylene)(tri-cyclohexylphosphine)ruthenium, available from SIGMA-ALDRICH;

BPO: benzoyl peroxide, available from NOF Corp.;

Topas COC 5013: polycycloolefin (cyclic olefin copolymer) without reactive functional groups, available from Topas Advanced Polymers;

OPE-2st 2200: vinylbenzyl-capped polyphenylene oxide resin, available from Mitsubishi Gas Chemical Co., Inc.;

Modified PPO: modified vinyl-containing polyphenylene oxide, made according to the process disclosed by U.S. patent application Ser. No. 14/643,627, the disclosure of which is incorporated herein;

TAIC: triallyl isocyanurate, available from Kingyorker Enterprise Co. Ltd.;

25B: 2,5-dimethyl-2,5-di(t-butylperoxy)hexyne-3, available from NOF Corp.;

SC-2050 SVJ: spherical silica, available from Admatechs;

PX-202: condensed phosphate ester, available from Daihachi Chemical Industry Co. Ltd.;

SPV-100: allyl phosphazene compound, available from Otsuka Chemical Co. Ltd.;

5-vinyl-2-norbornene, available from SIGMA-ALDRICH;

BMI-80: 2,2'-bis-[4-(4-maleimidephenoxy)phenyl]propane, available from KI Chemical.

Preparation Example 1

40 g of DCPD monomer and 60 g of vinyl-containing polyphenylene oxide (OPE-2st 2200, available from Mitsubishi Gas Chemical Co., Inc.) were well-mixed and dissolved in toluene, followed by the addition of 0.01 g of Grubbs $2^{nd}$ generation catalyst, (1,3-bis(2,4,6-trimethylphenyl)-2-imidazolidinylidene)dichloro(phenylmethylene) (tri-cyclohexylphosphine)ruthenium, followed by stirring and mixing at 80° C. for 10 hours, after which a dark brown solution was obtained as Product A, which is a polyphenylene oxide prepolymer.

Preparation Example 2

Basically identical to Preparation Example 1, except that Grubbs $2^{nd}$ generation catalyst was replaced by benzoyl peroxide (BPO), and a dark brown solution was obtained as Product B.

Preparation Example 3

Basically identical to Preparation Example 1, except that DCPD monomer was replaced by TAIC, and a dark brown solution was obtained as Product C.

Preparation Example 4

Basically identical to Preparation Example 2, except that DCPD monomer was replaced by TAIC, and a dark brown solution was obtained as Product D.

Preparation Example 5

Basically identical to Preparation Example 1, except that the vinyl-containing polyphenylene oxide was changed from OPE-2st to Component A disclosed in Preparation Example 1 of U.S. patent application Ser. No. 14/643,627, and a dark brown solution was obtained as Product E.

Fourier transform infrared spectroscopy (FTIR) was employed to analyze Product E in Preparation Example 5, and the result is shown in FIG. 1, wherein x-axis represents wavenumber ($cm^{-1}$) and y-axis represents transmittance (%). As can be observed, the characteristic peak at 908.36 $cm^{-1}$ indicates that the polyphenylene oxide prepolymer of Product E contains a vinyl group.

Figure 2:
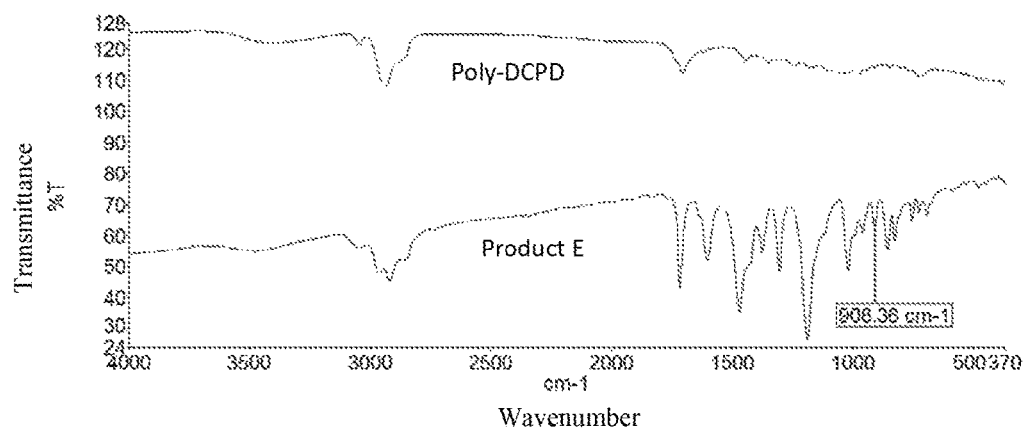
FIG. 2 compares the FTIR results of polyphenylene oxide prepolymer of Preparation Example 5 and poly-dicyclopentadiene (poly-DCPD) of Preparation Example 7.

FIG. 2 compares the FTIR results of polyphenylene oxide prepolymer of Preparation Example 5 and polydicyclopentadiene of Preparation Example 7.

Preparation Example 6

Basically identical to Preparation Example 1, except that DCPD monomer was replaced by polycycloolefin (Topas COC 5013), and a dark brown solution was obtained as Product F.

The structure of Topas COC 5013 is illustrated below:

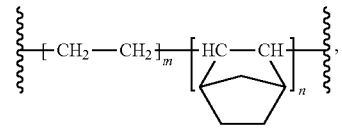

wherein m and n individually represent the same or different natural number.

Preparation Example 7

Basically identical to Preparation Example 5, except that vinyl-containing polyphenylene oxide was not used, and a dark brown solution was obtained as Product G, which contains poly-dicyclopentadiene (poly-DCPD).

Examples and results are listed in Table 1 and Table 2 below.

Each resin composition of different examples and comparative examples listed in Table 1 and Table 2 was added to a stirring tank, well-mixed and completely dissolved to obtain a varnish, which is then placed in an impregnation tank. For each resin composition thus prepared, a fiberglass cloth, such as 2116 E-glass fabric, was passed through the impregnation tank to impregnate the fiberglass cloth with the resin composition, followed by heating at 120 to 170° C. to a semi-cured state (B-staged) to obtain a prepreg.

Specimens were prepared as follows.

1. Copper Clad Laminates (Four-Layer)

Two 18 μm thickness high temperature elongation (HTE) copper foils and four prepregs obtained from each resin composition were prepared. The resin content of each prepreg is about 55%. The four prepregs were superimposed and sandwiched between the two copper foils and subject to a lamination process under vacuum at 195° C. for 2 hours to form a copper clad laminate (CCL), in which the four prepregs were cured to form the insulation layers between the two copper foils. The resin content of the insulation layers is about 55%.

2. Copper-Free Laminates (Four-Layer)

Each copper clad laminate was etched to remove the copper foils at both sides and obtain a copper-free laminate (four-layer), which comprises four prepregs laminated together and has a resin content of about 55%.

3. Copper-Free Laminates (Two-Layer)

Two 18 μm thickness high temperature elongation (HTE) copper foils and two prepregs obtained from each resin composition were prepared. The resin content of each prepreg is about 55%. The two prepregs were superimposed and placed between the two copper foils and subject to a lamination process under vacuum at 195° C. for 2 hours to form a copper clad laminate (two-layer). Next, each copper clad laminate was etched to remove the copper foils at both sides to obtain a copper-free laminate (two-layer), which comprises two prepregs laminated together and has a resin content of about 55%.

Test methods and property measurements were performed pursuant to the following procedures.

1. Resin Composition Gel Time Test (by Reference to IPC-TM-650 2.3.18)

Pipet seven drops of varnish, about 20 mg, to a hot plate of 171±0.5° C., and start the timing device immediately. After 60 seconds, circularly stroke the varnish with a toothpick at a rate of 120±10 circles/minute. Every circle moves part of the varnish from the center to the periphery until the diameter of the varnish is half of the hot plate, about 0.95 to 1.30 cm, such that the varnish is maintained at a diameter of 1.90 to 2.19 cm. Keep stroking the varnish until it becomes stiff, and keep stroking the largest piece. When the stroked piece is broken and stayed on the hot plate, stop the timing device. This is the end point, and the total elapsed time is the gel time. Repeat the process five times, three of which with closest measurements are used to calculate the average.

2. Resin Flow Test (by Reference to IPC-TM-650 2.3.17)

Prepare four plies of prepregs cut 4.0±0.010 inch by 4.0±0.010 inch as the specimen, the prepregs being made from impregnating and semi-curing the resin composition with 2116 fiberglass clothes, and determine the weight of the specimen as the original weight Wo. Stack the four prepregs according to the arrangement of steel plate/release film/four prepregs/release film/steel plate and place them into a laminating press maintained at 171±3° C. and 200±10 psi to proceed with hot pressing for five minutes. After that, remove the specimen and allow it to cool to room temperature. Use a punch and die set to remove a circular disc measuring 3.192 inch (81.1 mm) in diameter from the center of the specimen, and weigh the circular specimen as the disc weight Wd. The resin flow (%) is calculated as follows:

$$\text{Resin Flow (\%)} = \frac{Wo - 2Wd}{Wo} \times 100\%$$

3. Laminate Appearance Inspection

Visually inspect, with naked eyes, the surface of each copper-free laminate (four-layer) to determine whether it is flat and smooth or having weave exposure. The planar size of the copper-free laminate is 9 inch by 12 inch. If at least one weave exposure greater than 1×1 cm² is found, it is determined as a dry laminate. In other words, a laminate with flat and smooth surface is not designated as a dry laminate. A laminate with at least one weave exposure greater than 1×1 cm² is designated as a dry laminate. As known by a skilled person, dry laminates cannot be subject to subsequent processes for producing multi-layer boards or circuit boards.

4. Glass Transition Temperature (Tg)

In the glass transition temperature test, the aforesaid copper-free laminate (four-layer) is used as the specimen, which is subject to dynamic mechanical analysis (DMA) by reference to the procedure described in IPC-TM-650 2.4.24.4 to measure its glass transition temperature.

5. Thermal Expansion

In the thermal expansion test, the aforesaid copper-free laminate (four-layer) is used as the specimen, which is subject to thermal-mechanical analysis (TMA). The specimen is heated at a temperature rise of 10° C./min from 50° C. to 260° C. so as to measure the dimensional expansion, represented in %, of the specimen by reference to the procedure described in IPC-TM-650 2.4.24.5, wherein lower percentage is more preferred.

6. T288 Thermal Resistance

In the thermal resistance test, the aforesaid copper clad laminate (four-layer) (6.5 mm×6.5 mm) is used as the specimen, and a thermomechanical analyzer is used to measure the time to delamination of the copper clad laminate at a constant temperature 288° C. by reference to the procedure described in IPC-TM-650 2.4.24.1. Longer time to delamination represents higher thermal resistance of the copper clad laminate made from the resin composition.

7. Solder Dipping (S/D)

In the solder dipping test, the aforesaid copper clad laminate (four-layer) is used as the specimen, which is subject to tests and measurements performed by reference to the procedure described in IPC-TM-650 2.4.23 (Soldering Resistance of Laminate Materials). As a cycle, the specimen is immersed in a solder bath set to 288° C. for 10 seconds and then removed therefrom and placed at room temperature for 10 seconds. The specimen is then re-immersed in the solder bath for 10 seconds and removed therefrom and placed at room temperature for 10 seconds. The processes are repeated, and the number of cycles to blistering or delamination of each specimen is recorded. Generally, greater number of cycles to blistering or delamination of each specimen represents higher thermal resistance of the product, such as copper clad laminate, made from the resin composition.

8. Dielectric Constant and Dissipation Factor

In dielectric constant and dissipation factor measurements, the aforesaid copper-free laminate (two-layer) is used as the specimen. A microwave dielectrometer commercially available from AET Inc. is used by reference to the procedure described in JIS C2565 to make the measurements under room temperature (about 25° C.) at 10 GHz frequency. Lower dielectric constant and lower dissipation factor represent a better dielectric property of the specimen. A difference less than 0.05 in Dk indicates no significant difference in dielectric constant of laminates, and a difference greater than 0.05 in Dk indicates significant difference in dielectric constant of laminates. A difference less than 0.0005 in Df indicates no significant difference in dissipation factor of laminates, and a difference greater than 0.0005 in Df indicates significant difference in dissipation factor of laminates.

9. Dissipation Factor after Moisture Absorption

In the measurement of dissipation factor after moisture absorption, the aforesaid copper-free laminate (two-layer) is used as the specimen. The same dissipation factor measurement process described above is employed to test the Df of the specimen after it has been subject to 5-hour moisture absorption in an environment of 121° C. saturated water vapor.

10. Dissipation Factor at High Temperature

In the measurement of dissipation factor at high temperature, the aforesaid copper-free laminate (two-layer) is used as the specimen. The dissipation factor measurement process described above is followed, except that the specimen is measured at 120° C. but not room temperature (about 25° C.).

TABLE 1

| Component | Type | Example | E1 | C1 | C2 | C3 | E2 | C4 | C5 | C6 | C7 | C8 | C9 | C10 |
|---|---|---|---|---|---|---|---|---|---|---|---|---|---|---|
| Polyphenylene oxide | Prepolymer of DCPD and vinyl-containing polyphenylene oxide (with Grubbs catalyst) | Product A | 100 | | | | | | | | | | | |
| | Prepolymer of DCPD and vinyl-containing polyphenylene oxide (with peroxide BPO) | Product B | | 100 | | | | | | | | | | |
| | Prepolymer of TAIC and vinyl-containing polyphenylene oxide (with Grubbs catalyst) | Product C | | | 100 | | | | | | | | | |
| | Prepolymer of TAIC and vinyl-containing polyphenylene oxide (with peroxide BPO) | Product D | | | | 100 | | | | | | | | |
| | Prepolymer of DCPD and modified polyphenylene oxide (with Grubbs catalyst) | Product E | | | | | 100 | | | | | | | |
| | Prepolymer of Topas COC and vinyl-containing polyphenylene oxide (with Grubbs catalyst) | Product F | | | | | | 100 | | | | | | |
| | Vinyl-containing polyphenylene oxide | OPE-2st 2200 | | | | | | | 60 | | 60 | 60 | 100 | |
| | Modified polyphenylene oxide | | | | | | | | | 60 | | | | |
| Additive | | DCPD monomer | | | | | | | 40 | 40 | | | | 100 |
| | | Topas COC 5013 | | | | | | | | | 40 | | | |
| | | TAIC | | | | | | | | | | 40 | | |
| Catalyst | Ruthenium catalyst | Grubbs 2nd | | | | | | | 0.01 | 0.01 | 0.01 | 0.01 | 0.01 | 0.01 |
| | Peroxide | 25B | 1 | 1 | 1 | 1 | 1 | 1 | 1 | 1 | 1 | 1 | 1 | |
| Inorganic filler | spherical silica | SC-2050 SVJ | 30 | 30 | 30 | 30 | 30 | 30 | 30 | 30 | 30 | 30 | 30 | 30 |
| Solvent | | Toluene | 100 | 100 | 100 | 100 | 100 | 100 | 100 | 100 | 100 | 100 | 100 | 100 |
| | Gel time (average) | second | 304 | 278 | 469 | 256 | 289 | 15 | 350 | 480 | 15 | 450 | 60 | 100 |
| | Resin flow | % | 26 | 24 | 28 | 21 | 26 | 1 | 29 | 38 | 1 | 35 | 3 | 5 |

| Laminate property | Test Item (method) | Unit | E1 | C1 | C2 | C3 | E2 |
|---|---|---|---|---|---|---|---|
| Appearance | Visual inspection for dry laminate | NA | No | No | No | No | No |
| Glass transition temperature | Tg (DMA) | ° C. | 142 | 142 | 152 | 152 | 140 |
| Thermal expansion | Dimensional change (TMA) | % | 3.05 | 3.04 | 3.01 | 3.02 | 3.03 |
| 288° C. thermal resistance | T288 (TMA) | minutes | >70 | 58 | >70 | >70 | >70 |

TABLE 1-continued

| | | | | | | | |
|---|---|---|---|---|---|---|---|
| Solder dipping thermal resistance | S/D | cycles | >20 | >20 | >20 | >20 | >20 |
| Dielectric constant | Dk@10 GHz @25° C. | NA | 3.53 | 3.65 | 3.72 | 3.83 | 3.54 |
| Dissipation factor | Df@10 GHz @25° C. | NA | 0.0042 | 0.0045 | 0.0055 | 0.0055 | 0.0043 |
| Dissipation factor after moisture absorption | after 5-hour PCT, Df@10 GHz @25° C. | NA | 0.0045 | 0.0058 | 0.0072 | 0.0076 | 0.0047 |
| Dissipation factor at high temperature | Df @10 GHz & @120° C. | NA | 0.0047 | 0.0053 | 0.0068 | 0.0067 | 0.0048 |

| Laminate property | C4 | C5 | C6 | C7 | C8 | C9 | C10 |
|---|---|---|---|---|---|---|---|
| Appearance | Yes | No | No | Yes | No | Yes | Yes |
| Glass transition temperature | — | 148 | 145 | 100 | 195 | 190 | 170 |
| Thermal expansion | — | 3.25 | 3.28 | 3.25 | 3.38 | 3.35 | 3.55 |
| 288° C. thermal resistance | — | 32 | 30 | 31 | >70 | 33 | 30 |
| Solder dipping thermal resistance | — | 17 | 15 | 10 | >20 | 18 | 19 |
| Dielectric constant | — | 3.75 | 3.76 | 3.45 | 3.76 | 3.78 | 3.48 |
| Dissipation factor | — | 0.0055 | 0.0058 | 0.0041 | 0.0054 | 0.0066 | 0.0035 |
| Dissipation factor after moisture absorption | — | 0.0067 | 0.0069 | 0.0056 | 0.0072 | 0.0076 | 0.0043 |
| Dissipation factor at high temperature | — | 0.0063 | 0.0072 | 0.0057 | 0.0063 | 0.0073 | 0.0040 |

(—) represents no laminate could be made from the resin composition so no test was available.

TABLE 2

| Component | Type | Example | E3 | C11 | C12 | C13 | E4 | E5 | E6 | C14 | C15 | C16 | C17 | C18 |
|---|---|---|---|---|---|---|---|---|---|---|---|---|---|---|
| Polyphenylene oxide | Prepolymer of DCPD and vinyl-containing polyphenylene oxide (with Grubbs catalyst) | Product A | 100 | | | | | 50 | | | | | | |
| | Prepolymer of DCPD and vinyl-containing polyphenylene oxide (with peroxide BPO) | Product B | | 100 | | | | | | | | | | |
| | Prepolymer of TAIC and vinyl-containing polyphenylene oxide (with Grubbs catalyst) | Product C | | | 100 | | | | | | | | | |
| | Prepolymer of TAIC and vinyl-containing polyphenylene oxide (with peroxide BPO) | Product D | | | | 100 | | | | | | | | |
| | Prepolymer of DCPD and modified polyphenylene oxide (with Grubbs catalyst) | Product E | | | | | 100 | | 50 | | | | | |
| | Prepolymer of Topas COC and vinyl-containing polyphenylene oxide (with Grubbs catalyst) | Product F | | | | | | | | 100 | | | | |
| | Vinyl-containing polyphenylene oxide | OPE-2st 2200 | | | | | 50 | | | | 60 | | 60 | 60 |
| | Modified polyphenylene oxide | | | | | | | 50 | | | | 60 | | |

TABLE 2-continued

| Additive | | | | | | | | | | | | | | |
|---|---|---|---|---|---|---|---|---|---|---|---|---|---|---|
| | DCPD monomer | | | | | | | | | | 40 | 40 | | |
| | Polyolefin | Topas COC 5013 | | | | | | | | | | | 40 | |
| | TAIC | | | | | | | | | | | | | 40 |
| Flame retardant | Condensed phosphate ester | PX-202 | 30 | 30 | 30 | 30 | 30 | 30 | 30 | 30 | 30 | 30 | 30 | 30 |
| | Allyl phosphazene | SPY-100 | 35 | 35 | 35 | 35 | 35 | 35 | 35 | 35 | 35 | 35 | 35 | 35 |
| Crosslinking agent | norbornene | 5-Vinyl-2-norbornene | 5 | 5 | 5 | 5 | 5 | 5 | 5 | 5 | 5 | 5 | 5 | 5 |
| | Maleimide | BMI-80 | 5 | 5 | 5 | 5 | 5 | 5 | 5 | 5 | 5 | 5 | 5 | 5 |
| Metal catalyst | Ruthenium catalyst | Grubbs $2^{nd}$ | | | | | | | | | 0.01 | 0.01 | 0.01 | 0.01 |
| Peroxide | Peroxide | 25B | 0.5 | 0.5 | 0.5 | 0.5 | 0.5 | 0.5 | 0.5 | 0.5 | 0.5 | 0.5 | 0.5 | 0.5 |
| Inorganic filler | spherical silica | SC-2050 SVJ | 70 | 70 | 70 | 70 | 70 | 70 | 70 | 70 | 70 | 70 | 70 | 70 |
| Solvent | | Toluene | 100 | 100 | 100 | 100 | 100 | 100 | 100 | 100 | 100 | 100 | 100 | 100 |
| | | MEK | 30 | 30 | 30 | 30 | 30 | 30 | 30 | 30 | 30 | 30 | 30 | 30 |

| Laminate property | Test Item (method) | Unit | E3 | C11 | C12 | C13 | E4 |
|---|---|---|---|---|---|---|---|
| Glass transition temperature | Tg (DMA) | °C. | 195 | 195 | 197 | 198 | 205 |
| Thermal expansion | Dimensional change (TMA) | % | 2.62 | 2.65 | 2.89 | 2.87 | 2.61 |
| 288° C. thermal resistance | T288 (TMA) | minutes | >70 | >70 | >70 | >70 | >70 |
| Solder dipping thermal resistance | S/D | cycles | >20 | >20 | >20 | >20 | >20 |
| Dielectric constant | Dk@10 GHz | NA | 3.65 | 3.65 | 3.75 | 3.76 | 3.65 |
| Dissipation factor | Df@10 GHz | NA | 0.0051 | 0.0052 | 0.0059 | 0.006 | 0.0052 |
| Flame retardancy | UL94 | NA | V-0 | V-0 | V-0 | V-0 | V-0 |
| Resin flow | RF | % | 27 | 23 | 28 | 25 | 28 |

| Laminate property | E5 | E6 | C14 | C15 | C16 | C17 | C18 |
|---|---|---|---|---|---|---|---|
| Glass transition temperature | 194 | 192 | — | 167 | 193 | 192 | 198 |
| Thermal expansion | 2.91 | 3.01 | — | 3.24 | 2.73 | 2.88 | 2.91 |
| 288° C. thermal resistance | >70 | >70 | — | >70 | >70 | 30 | >70 |
| Solder dipping thermal resistance | >20 | >20 | — | >20 | >20 | 13 | >20 |
| Dielectric constant | 3.75 | 3.75 | — | 3.88 | 3.71 | 3.63 | 3.61 |
| Dissipation factor | 0.0054 | 0.0054 | — | 0.0062 | 0.0054 | 0.0058 | 0.0062 |
| Flame retardancy | V-0 | V-0 | — | V-0 | V-0 | V-0 | V-0 |
| Resin flow | 25 | 15 | — | 27 | 21 | 3 | 23 |

The above detailed description is merely illustrative in nature and is not intended to limit the embodiments of the subject matter or the application and uses of such embodiments. As used herein, the term "exemplary" means "serving as an example, instance, or illustration." Any implementation described herein as exemplary is not necessarily to be construed as preferred or advantageous over other implementations, unless specified otherwise.

Moreover, while at least one exemplary embodiment has been presented in the foregoing detailed description, it should be appreciated that a vast number of variations exist. It should also be appreciated that the exemplary one or more embodiments described herein are not intended to limit the scope, applicability, or configuration of the claimed subject matter in any way. Rather, the foregoing detailed description will provide those skilled in the art with a convenient guide for implementing the described one or more embodiments. Also, the scope defined by the claims includes known equivalents and foreseeable equivalents at the time of filing this patent application.

What is claimed is:

1. A process of making a polyphenylene oxide prepolymer, comprising reacting a reactive cycloolefin and a vinyl-containing polyphenylene oxide in the presence of a ruthenium catalyst.

2. The process of claim 1, wherein the reactive cycloolefin and the vinyl-containing polyphenylene oxide are reacted at a temperature of 50 to 100° C.

3. The process of claim 1, wherein the reactive cycloolefin is selected from the group consisting of dicyclopentadiene monomer, dicyclopentadiene oligomer, dicyclopentadiene polymer, norbornene monomer, norbornene oligomer, norbornene polymer, and a combination thereof.

4. The process of claim 1, wherein the vinyl-containing polyphenylene oxide is selected from the group consisting of divinylbenzyl polyphenylene oxide resin, vinylbenzyl-modified polyphenylene oxide resin, methacrylic polyphenylene oxide resin, and a combination thereof.

5. The process of claim 1, wherein the ruthenium catalyst is a Grubbs catalyst.

6. The process of claim 5, wherein the Grubbs catalyst is selected from the group consisting of the following compounds and a combination thereof:

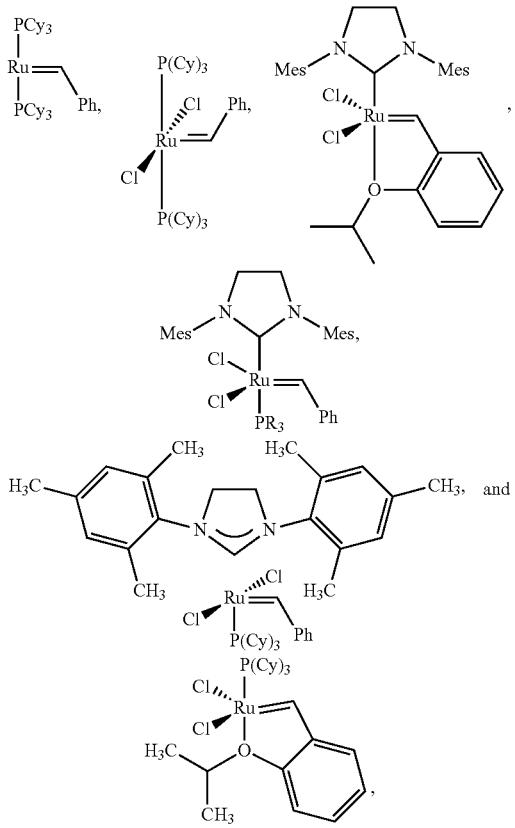

wherein Cy represents cyclohexyl, Ph represents phenyl, Mes represents 2,4,6-trimethylphenyl and R represents cyclohexyl.

7. The process of claim 5, wherein the Grubbs catalyst is dichloro(o-isopropoxyphenyl methylene)(tricyclohexylphosphine)ruthenium(II), ((1,3-bis-(2,4,6-trimethylphenyl)-2-imidazolidinylidene)dichloro(o-isopropoxyphenylmethylene)ruthenium) or a combination thereof.

8. A polyphenylene oxide prepolymer made by the process of claim 1.

9. The polyphenylene oxide prepolymer of claim 8, characterized by comprising a vinyl group.

10. A resin composition comprising the polyphenylene oxide prepolymer of claim 8 and an additive.

11. The resin composition of claim 10, comprising from 1 to 50 parts by weight of the additive relative to 100 parts by weight of the polyphenylene oxide prepolymer.

12. The resin composition of claim 10, wherein the additive is selected from the group consisting of polyphenylene oxide, cyanate ester, maleimide, polyolefin, acrylate, 1,1'-[(octahydro-4,7-methano-1H-indene-5,6-diyl)bis(methylene)]ester, styrene, bromostyrene, 2-propenoic acid, divinylbenzene, bis(vinylbenzyl) ether, triallyl isocyanurate, triallyl cyanurate, 1,2,4-trivinylcyclohexane, diallyl bisphenol A, 2-propenoic acid, and a combination thereof.

13. The resin composition of claim 12, wherein the polyolefin is selected from the group consisting of styrene-butadiene-divinylbenzene terpolymer, styrene-butadiene-maleic anhydride terpolymer, vinyl-polybutadiene-urethane oligomer, styrene-butadiene copolymer, hydrogenated styrene-butadiene copolymer, styrene-isoprene copolymer, hydrogenated styrene-isoprene copolymer, hydrogenated styrene-butadiene-divinylbenzene copolymer, polybutadiene, maleic anhydride-styrene-butadiene copolymer, methyl styrene copolymer, and a combination thereof.

14. The resin composition of claim 10, further comprising epoxy resin, phenolic resin, benzoxazine resin, styrene maleic anhydride, polyester, amine curing agent, polyamide, polyimide or a combination thereof.

15. The resin composition of claim 10, further comprising flame retardant, inorganic filler, curing accelerator, solvent or a combination thereof.

16. A product made from the resin composition of claim 10, comprising a resin film, a prepreg, a laminate or a printed circuit board.

17. The product of claim 16, wherein a variation ratio of dissipation factor of the product measured by reference to JIS C2565 at 10 GHz before and after the product has been subjected to a pressure cooking test by reference to IPC-TM-650 2.6.16.1 at 121° C. for 5 hours is less than 10%.

18. The product of claim 16, wherein a dissipation factor of the product measured by reference to JIS C2565 at 10 GHz after the product has been subjected to a pressure cooking test by reference to IPC-TM-650 2.6.16.1 at 121° C. for 5 hours is less than 0.0050.

19. The product of claim 16, wherein a change percentage of dissipation factor of the product measured by reference to JIS C2565 at 10 GHz at 25° C. and at 120° C. is less than 15%.

20. The product of claim 16, wherein a dissipation factor of the product measured by reference to JIS C2565 at 10 GHz at 120° C. is less than 0.0050.

* * * * *